(12) United States Patent
Kawamonzen et al.

(10) Patent No.: US 8,916,053 B2
(45) Date of Patent: Dec. 23, 2014

(54) PATTERN FORMING METHOD

(75) Inventors: Yoshiaki Kawamonzen, Tokyo (JP);
Yasuaki Ootera, Yokohama (JP); Akiko Yuzawa, Kawasaki (JP); Naoko Kihara, Kawasaki (JP); Yoshiyuki Kamata, Tokyo (JP); Hiroyuki Hieda, Yokohama (JP); Norikatsu Sasao, Tokyo (JP); Ryosuke Yamamoto, Kawasaki (JP); Takeshi Okino, Yokohama (JP); Tomoyuki Maeda, Kawasaki (JP); Takuya Shimada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/528,348

(22) Filed: Jun. 20, 2012

(65) Prior Publication Data

US 2013/0075361 A1    Mar. 28, 2013

(30) Foreign Application Priority Data

Sep. 26, 2011    (JP) .................................. 2011-209336

(51) Int. Cl.
*C03C 15/00* (2006.01)
*C03C 25/68* (2006.01)
*C23F 1/00* (2006.01)
*B44C 3/08* (2006.01)
*B44C 5/04* (2006.01)
*B81C 1/00* (2006.01)
*B44C 1/22* (2006.01)
*H01L 21/033* (2006.01)
*G03F 7/00* (2006.01)
*B41M 5/00* (2006.01)

(52) U.S. Cl.
CPC .............. *B44C 1/227* (2013.01); *B81C 1/0046* (2013.01); *H01L 21/0337* (2013.01); *B81C 2201/0153* (2013.01); *G03F 7/0002* (2013.01); *B41M 5/00* (2013.01)
USPC ................... 216/43; 216/41; 216/54; 216/55; 156/220

(58) Field of Classification Search
CPC .... B44C 1/17; B81C 1/0046; B81C 1/00476; B41M 5/0011; G03F 7/0012; B32B 37/26
USPC .................................. 216/41, 54, 55; 156/220
See application file for complete search history.

(56) References Cited

U.S. PATENT DOCUMENTS

| | | | | |
|---|---|---|---|---|
| 2006/0049698 | A1* | 3/2006 | Zaal et al. ........................ | 310/12 |
| 2010/0213169 | A1* | 8/2010 | Hiraoka .......................... | 216/41 |
| 2010/0291728 | A1* | 11/2010 | Huh et al. ........................ | 438/71 |
| 2012/0132273 | A1* | 5/2012 | Lee et al. ....................... | 136/256 |
| 2012/0223418 | A1* | 9/2012 | Stowers et al. ............... | 257/632 |

FOREIGN PATENT DOCUMENTS

| | | |
|---|---|---|
| JP | 2003-155365 | 5/2003 |
| JP | 2004-335775 | 11/2004 |
| JP | 2008-105414 | 5/2008 |
| JP | 2009-190300 | 8/2009 |
| JP | 2011-081902 | 4/2011 |
| JP | 2011-108805 | 6/2011 |

OTHER PUBLICATIONS

Office Action mailed Oct. 24, 2014 in counterpart Japanese Patent Application No. 2011-209336 and English-language translation thereof.

* cited by examiner

*Primary Examiner* — Binh X Tran
*Assistant Examiner* — Thomas Pham
(74) *Attorney, Agent, or Firm* — Nixon & Vanderhye, P.C.

(57) ABSTRACT

A pattern forming method according to an embodiment includes: forming a pattern film on a first substrate, the pattern film having a concave-convex pattern, the pattern film being made of a material containing a first to-be-imprinted agent; forming a material film on a second substrate, the material film containing a second to-be-imprinted agent having a higher etching rate than an etching rate of the first to-be-imprinted agent; transferring the concave-convex pattern of the pattern film onto the material film by applying pressure between the first substrate and the second substrate, with the pattern film being positioned to face the material film, and by curing the second to-be-imprinted agent; detaching the first substrate from the pattern film; and removing the material film by etching, to leave the pattern film on the second substrate.

7 Claims, 7 Drawing Sheets

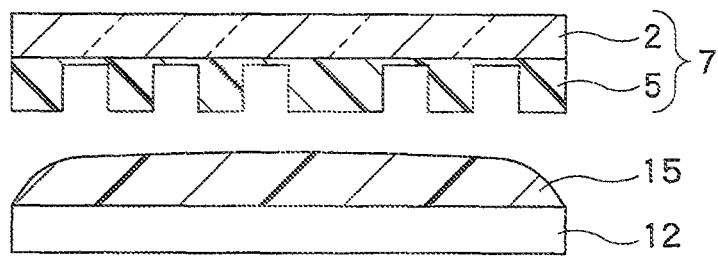
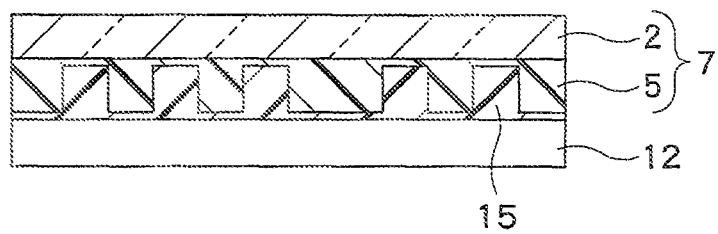
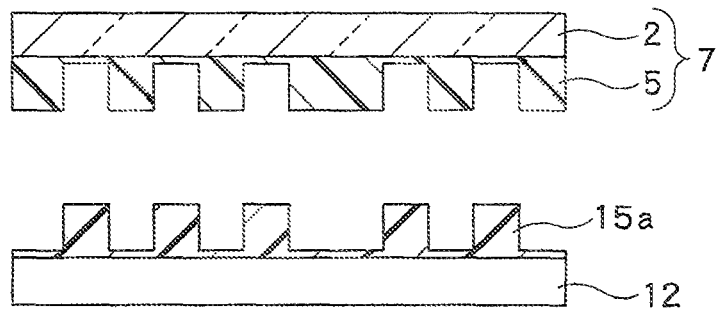
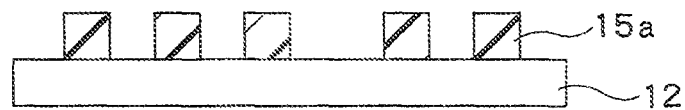
FIG.2

| TO-BE-IMPRINTED AGENT | PURPOSE OF USE | PHOTOSENSITIVE MONOMER (ACRYLATE COMPOUND) | | | | | | PHOTO-SENSITIZING AGENT | ETCHING RATE | |
|---|---|---|---|---|---|---|---|---|---|---|
| | | IBOA (wt%) | MADA (wt%) | AEPFL (wt%) | TMPTA (wt%) | PU370 (wt%) | | IRG369 (wt%) | $O_2$ (nm/s) | $CF_4$ (nm/s) |
| IMP-A1 | FIRST TO-BE-IMPRINTED AGENT | 26.1 | 21.1 | 22.8 | 29.5 | – | | 0.5 | 0.98 | 0.15 |
| IMP-A2 | FIRST TO-BE-IMPRINTED AGENT | 27.4 | 21.9 | 24.9 | – | 25.3 | | 0.5 | 1 | 0.15 |
| IMP-A3 | FIRST TO-BE-IMPRINTED AGENT | 56.3 | – | 38.1 | 5.1 | – | | 0.5 | 0.77 | 0.12 |
| IMP-A4 | FIRST TO-BE-IMPRINTED AGENT | EA-F5503, MANUFACTURED BY OSAKA GAS CHEMICALS Co., Ltd. (99.5wt%) | | | | | | 0.5 | 0.87 | 0.14 |
| IMP-A5 | FIRST TO-BE-IMPRINTED AGENT | MUR-XR02 (CONTAINING PHOTOSENSITIZING AGENT) MANUFACTURED BY MARUZEN PETROCHEMICAL Co., Ltd. (100wt%) | | | | | | | 0.86 | 0.13 |
| IMP-B1 | SECOND TO-BE-IMPRINTED AGENT | GBLA (99.5wt%) | | | | | | 0.5 | 4.53 | 0.98 |
| IMP-B2 | SECOND TO-BE-IMPRINTED AGENT | CHDOA (99.5wt%) | | | | | | 0.5 | 3.81 | 0.81 |
| IMP-X1 | TO-BE-IMPRINTED AGENT FOR COMPARATIVE EXAMPLE | ADK-16 (CONTAINING PHOTOSENSITIZING AGENT) MANUFACTURED BY ADEKA CORPORATION (100wt%) | | | | | | | 1.89 | 0.4 |

IBOA : ISOBORNYL ACRYLATE
MADA : 2-METHYL-2-ADAMANTYL ACRYLATE
AEPFL : 9,9-BIS(4-(2-(ACRYLOYLOXY)ETHOXY)PHENYL)FLUORENE
TMPTA : TRIMETHYLOLPROPANE ACRYLATE
PU-370 : TRIFUNCTIONAL AROMATIC URETHANE ACRYLATE OLIGOMER, MANUFACTURED BY MIWON COMMERCIAL Co., Ltd.
GBLA : γ-BUTYROLACTONE ACRYLATE
CHDOA : (1,4-DIOXASPIRO [4,5] DECANE-2-YL)METHYL ACRYLATE
IGR369 : IRUGACURE369, MANUFACTURED BY BASF SE

FIG. 3

| | FIRST STEP | | | | SECOND STEP | | |
|---|---|---|---|---|---|---|---|
| | FIRST SUBSTRATE | FIRST TO-BE-IMPRINTED AGENT | MOLD | STATUS OF PATTERN FILM FORMATION | SECOND SUBSTRATE | SECOND TO-BE-IMPRINTED AGENT | STATUS OF PATTERN FILM ADHESION |
| EXAMPLE 1 | QUARTZ GLASS | IMP-A1 | NICKEL STAMPER | EXCELLENT DOT PATTERN FORMED | SILICON WAFER | IMP-B1 | EXCELLENT ADHESION-TRANSFER PERFORMED |
| EXAMPLE 2 | POLY-CARBONATE | IMP-A1 | NICKEL STAMPER | EXCELLENT DOT PATTERN FORMED | SILICON WAFER | IMP-B1 | EXCELLENT ADHESION-TRANSFER PERFORMED |
| EXAMPLE 3 | POLY-CARBONATE | IMP-A1 | QUARTZ STAMPER | EXCELLENT DOT PATTERN FORMED | SILICON WAFER | IMP-B1 | EXCELLENT ADHESION-TRANSFER PERFORMED |
| EXAMPLE 4 | QUARTZ GLASS | IMP-A1 | NICKEL STAMPER | EXCELLENT DOT PATTERN FORMED | SILICON WAFER | IMP-B2 | EXCELLENT ADHESION-TRANSFER PERFORMED |
| EXAMPLE 5 | QUARTZ GLASS | IMP-A1 | NICKEL STAMPER | EXCELLENT DOT PATTERN FORMED | MAGNETIC FILM SUBSTRATE | IMP-B1 | EXCELLENT ADHESION-TRANSFER PERFORMED |
| EXAMPLE 6 | QUARTZ GLASS | IMP-A2 | NICKEL STAMPER | EXCELLENT DOT PATTERN FORMED | SILICON WAFER | IMP-B1 | EXCELLENT ADHESION-TRANSFER PERFORMED |
| EXAMPLE 7 | QUARTZ GLASS | IMP-A3 | NICKEL STAMPER | EXCELLENT DOT PATTERN FORMED | SILICON WAFER | IMP-B1 | EXCELLENT ADHESION-TRANSFER PERFORMED |
| EXAMPLE 8 | QUARTZ GLASS | IMP-A4 | NICKEL STAMPER | EXCELLENT DOT PATTERN FORMED | SILICON WAFER | IMP-B1 | EXCELLENT ADHESION-TRANSFER PERFORMED |
| EXAMPLE 9 | QUARTZ GLASS | IMP-A5 | NICKEL STAMPER | EXCELLENT DOT PATTERN FORMED | SILICON WAFER | IMP-B1 | EXCELLENT ADHESION-TRANSFER PERFORMED |
| EXAMPLE 10 | QUARTZ GLASS | IMP-A5 | NICKEL STAMPER | EXCELLENT DOT PATTERN FORMED | MAGNETIC FILM SUBSTRATE | IMP-B1 | EXCELLENT ADHESION-TRANSFER PERFORMED |

FIG. 5A

| | THIRD STEP | | FOURTH STEP | |
|---|---|---|---|---|
| | ETCHING | STATUS OF DOT PATTERN MASK FORMATION | ETCHING | STATUS OF DOT PATTERN MASK FORMATION |
| EXAMPLE 1 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 2 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 3 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 4 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 5 | $O_2$ DRY ETCHING | DOTS WITH φ10nm AND 20-nm PITCH FORMED | Ar GAS MILLING | DOTS WITH φ10nm AND 20-nm PITCH FORMED |
| EXAMPLE 6 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 7 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 8 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 9 | $O_2$ DRY ETCHING | DOTS WITH φ10nm AND 20-nm PITCH FORMED | $SF_6$ DRY ETCHING | DOTS WITH φ10nm AND 20-nm PITCH FORMED |
| EXAMPLE 10 | $O_2$ DRY ETCHING | DOTS WITH φ10nm AND 20-nm PITCH FORMED | Ar GAS MILLING | DOTS WITH φ10nm AND 20-nm PITCH FORMED |

| | IMPRINT STEP | | | | ETCHING STEP | |
|---|---|---|---|---|---|---|
| | SUBSTRATE | TO-BE-IMPRINTED AGENT | MOLD | STATUS OF PATTERN FILM FORMATION | ETCHING | STATUS OF DOT PATTERN FORMATION |
| COMPARATIVE EXAMPLE 1 | SILICON WAFER | IMP-A1 | QUARTZ STAMPER | NOT ADHERING TO SUBSTRATE, BUT ADHERING TO MOLD | — | — |
| COMPARATIVE EXAMPLE 2 | MAGNETIC FILM SUBSTRATE | IMP-A1 | QUARTZ STAMPER | NOT ADHERING TO SUBSTRATE, BUT ADHERING TO MOLD | — | — |
| COMPARATIVE EXAMPLE 3 | SILICON WAFER | IMP-A2 | QUARTZ STAMPER | MANY MISSING DOTS DUE TO INSUFFICIENT REMOVAL | — | — |
| COMPARATIVE EXAMPLE 4 | SILICON WAFER | IMP-A5 | QUARTZ STAMPER | MANY MISSING DOTS DUE TO INSUFFICIENT REMOVAL | — | — |
| COMPARATIVE EXAMPLE 5 | SILICON WAFER | IMP-X1 | QUARTZ STAMPER | EXCELLENT DOT PATTERN FORMED | O$_2$ DRY ETCHING | EXCELLENT DOT PATTERN NOT FORMED |

PATTERN FORMING METHOD

CROSS REFERENCE TO RELATED APPLICATIONS

This application is based upon and claims the benefit of priority from prior Japanese Patent Application No. 2011-209336 filed on Sep. 26, 2011 in Japan, the entire contents of which are incorporated herein by reference.

FIELD

Embodiments described herein relate generally to a pattern forming method.

BACKGROUND

In recent years, microfabrication techniques of a 10-nm pitch level that excel in mass productivity have been required to form ultrafine patterns in LSIs (Large-Scale Integrated circuits), HDDs (Hard Disk Drives), and the like.

At present, PEP (Photo Engraving Process) techniques based on photolithography are often used in substrate microfabrication. However, the resolution limit of the PEP techniques is approximately 35 nm to 40 nm, and it is difficult to perform miniaturization at a lower resolution than 35 nm.

Meanwhile, the resolution limit of PEP techniques based on electronic lithography is 15 nm to 20 nm. Accordingly, it is possible to perform microfabrication at the pitch of this resolution limit. However, even where a PEP technique based on electronic lithography is used, it is difficult to perform microfabrication at a lower resolution than 15 nm. Furthermore, such a PEP technique requires a long pattern drawing time, and therefore, is not suited for mass-production processes.

Nanoimprint techniques are drawing attention as techniques that excel in terms of microfabrication and mass productivity, and recently, have been put into practical use as pattern forming methods on the order of several tens to several hundreds of nanometers.

By conventional nanoimprint techniques, however, defective transfers often occur at the time of template removal in the imprint process, and defects appear in the obtained fine patterns.

BRIEF DESCRIPTION OF THE DRAWINGS

FIGS. 2(a) through 2(d) are cross-sectional views illustrating a pattern forming method according to a comparative example;

FIG. 3 is a diagram showing the characteristics of to-be-imprinted agents;

FIG. 5A is a diagram showing manufacturing conditions in Examples 2 through 10;

FIG. 5B is a diagram showing manufacturing conditions in Examples 2 through 10; and FIG. 6 is a diagram showing manufacturing conditions in Comparative Examples 1 through 5.

DETAILED DESCRIPTION

Figure 1:
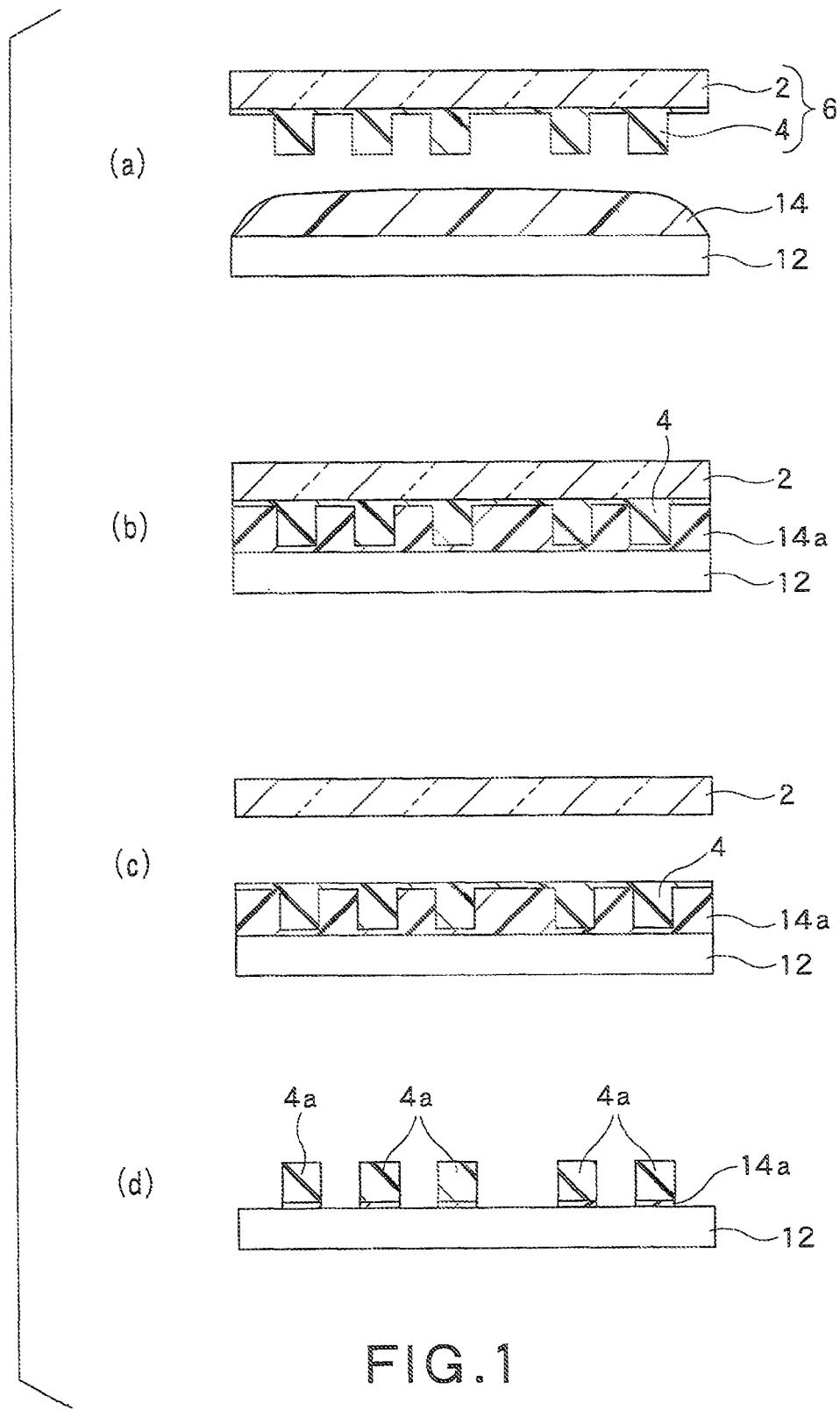
FIGS. 1(a) through 1(d) are cross-sectional views illustrating a pattern forming method according to an embodiment.

A pattern forming method according to an embodiment includes: forming a pattern film on a first substrate, the pattern film having a concave-convex pattern, the pattern film being made of a material containing a first to-be-imprinted agent; forming a material film on a second substrate, the material film containing a second to-be-imprinted agent having a higher etching rate than an etching rate of the first to-be-imprinted agent; transferring the concave-convex pattern of the pattern film onto the material film by applying pressure between the first substrate and the second substrate, with the pattern film being positioned to face the material film, and by curing the second to-be-imprinted agent; detaching the first substrate from the pattern film; and removing the material film by etching, to leave the pattern film on the second substrate.

The following is a detailed description of the contents of the present invention. In the following description, the described components are based on a typical embodiment of the present invention, but the present invention is not limited to such an embodiment. It should be noted that, in this specification, the numerical range expressed by the wording "a number to another number" means the range that falls between the former number indicating the lower limit of the range and the latter number indicating the upper limit of the range.

In this specification, "(meth)acrylate" means acrylate and methacrylate, "(meth)acrylic" means acrylic and methacrylic, and "(meth)acryloyl" means acryloyl and methacryloyl. In the present invention, monomers are distinguished from oligomers and polymers, and monomers are compounds each having a weight-average molecular weight of 1,000 or less. In this specification, a "polymerizable compound" means a compound having a polymerizable functional group, or more specifically, a compound having a group involved in a polymerization reaction. In this specification, "imprint" is preferably a pattern transfer of 1 nm to 10 mm in size, or more preferably, a pattern transfer of 3 nm to 100 μm in size (nanoimprint).

As to the term "group (atomic group)" in this specification, the term not accompanied by "substituted" or "unsubstituted" means both a group having no substituents and a group having a substituent. For example, "alkyl groups" include not only alkyl groups with no substituents (unsubstituted alkyl groups) but alkyl groups having substituents (substituted alkyl groups).

Embodiment

Referring to FIGS. 1(a) through 1(d), a pattern forming method according to an embodiment is described. FIGS. 1(a) through 1(d) are cross-sectional views illustrating the procedures according to the pattern forming method of this embodiment. According to the pattern forming method of this embodiment, a nanoimprint technique is used.

First, a template 6 including a pattern film 4 formed thereon is prepared on a dummy substrate 2. The pattern film 4 then has a concave-convex pattern that is made of a to-be-imprinted agent with a high etching resistance (i.e. a low etching rate) (FIG. 1(a)). A to-be-imprinted agent 14 having a lower etching resistance (i.e. a high etching rate) than that of the to-be-imprinted agent forming the pattern film 4 is then bonded onto a to-be-processed substrate 12 (FIG. 1(a)). At this point, the to-be-imprinted agent 14 is in an uncured state.

The template 6 is then positioned so that the concave-convex pattern of the template 6 faces the to-be-imprinted agent 14. The template 6 is pressed against the to-be-imprinted agent 14, and the to-be-imprinted agent 14 is then molded and cured (FIG. 1(b)). As a result, the to-be-imprinted agent 14 turns into a pattern film 14a having a pattern transferred thereonto. The positions of the concavities and convexities of the pattern are the opposite of those of the pattern film 4.

The dummy substrate 2 is then detached from the pattern film 4 (FIG. 1(c)). The pattern film 4 and the pattern film 14a remain on the to-be-processed substrate 12, with the concavities and convexities of the pattern film 4 being in meshing engagement with the concavities and convexities of the pattern film 14a (FIG. 1(c)). Therefore, the to-be-imprinted agent forming the pattern film 4 used in this embodiment is preferably made of a material having higher adhesion to the to-be-imprinted agent 14 than that to the dummy substrate 2. Further, the to-be-imprinted agent 14 is preferably made of a material with high adhesion.

Etching is then performed on the pattern film 14a. The pattern film 4 has a high etching resistance (or a low etching rate), and the pattern film 14a has a low etching resistance (or a high etching rate). Accordingly, the pattern film 14a is etched. On the other hand, the pattern film 4 is hardly etched, and after the etching, the pattern film 4 turns into a pattern 4a retaining the original form (the concave-convex pattern) (FIG. 1(d)). It should be noted that, after the etching, the to-be-imprinted agent 14 remains between the pattern 4a and the to-be-processed substrate 12 (FIG. 1(d)). After that, with the pattern 4a serving as a mask, etching is performed on the to-be-processed substrate 12 as needed, to form a pattern on the to-be-processed substrate 12. The pattern 4a is then removed. It should be noted that a pattern may not be formed on the to-be-processed substrate 12 by using the pattern 4a as a mask, and the pattern 4a may remain on the to-be-processed substrate 12.

Comparative Example

Referring now to FIGS. 2(a) through 2(d), a pattern forming method according to a comparative example of this embodiment is described.

First, a template 7 having a pattern film 5 formed on a dummy substrate 2 is prepared. The pattern film 5 has a concave-convex pattern that is made of a to-be-imprinted agent (FIG. 2(a)). A to-be-imprinted agent 15 is then bonded onto a to-be-processed substrate 12 (FIG. 2(a)). At this point, the to-be-imprinted agent 15 is in an uncured state.

The template 7 is then positioned so that the concave-convex pattern of the template 7 faces the to-be-imprinted agent 15. The template 7 is pressed against the to-be-imprinted agent 15, and the to-be-imprinted agent 15 is then molded and cured (FIG. 2(b)). As a result, the to-be-imprinted agent 15 turns into a pattern film 15a having a pattern transferred thereonto. The positions of the concavities and convexities of the pattern are the opposite of those of the pattern film 5.

The template 7 is then detached from the pattern film 15a (FIG. 2(c)). To cause no defective transfers in the pattern on the pattern film 15a in this stage, the to-be-imprinted agent 15 forming the pattern film 15a is preferably made of a material that has high adhesion to the to-be-processed substrate 12 and high detachability from the template 7.

The bottom portions of the concavities of the pattern film 15a are removed by etching, to expose the surface of the to-be-processed substrate 12 through the bottoms of the concavities (FIG. 2(d)). After that, with the pattern film 15a serving as a mask, etching is performed on the to-be-processed substrate 12 as needed, to form a pattern on the to-be-processed substrate 12.

As described above, according to the pattern forming method of this embodiment, there is no need to detach the template 6 from the cured to-be-imprinted agent 14 as in the comparative example. Accordingly, defective pattern transfers with missing dots and the like do not easily occur in this embodiment. Further, according to this embodiment, the pattern 4a is formed on the to-be-processed substrate 12 by using the difference in etching rate. Accordingly, a fine pattern can be formed as the pattern 4a.

The to-be-imprinted agent forming the pattern film 4 to be used in the pattern forming method of this embodiment can also be made of a material that has a higher etching resistance than that of the to-be-imprinted agent 14 and has high detachability from the dummy substrate 2. The to-be-imprinted agent 14 can be made of a material having high adhesion to the to-be-imprinted agent forming the pattern film 4. Therefore, there is no need to achieve both the adhesion to the to-be-processed substrate 12 and the detachability from the template 6 that are both essential in the comparative example. Accordingly, the method of this embodiment has the advantage that there is a wider variety of choices for to-be-imprinted agents, compared with the method of the comparative example.

Further, in this embodiment, etching is performed on the pattern 4a supported by the to-be-imprinted agent 14. Accordingly, etching can be performed in a stable manner.

In the following, materials that can be used in this embodiment are described in detail.

Pattern Film 4

First, the pattern film 4 used in this embodiment is described. According to the pattern forming method of this embodiment, the pattern film 4 is formed as a processing resist mask on the to-be-processed substrate 12. Therefore, the pattern film 4 is required to have an etching resistance to dry etching to be performed on the to-be-imprinted agent 14 with an $O_2$ gas or a $CF_4$ gas, or to wet etching to be performed with an organic solvent, an alkaline developer, or the like. The pattern film 4 also functions as a resist mask for processing the to-be-processed substrate 12. Therefore, the pattern film 4 is required to have a resistance to dry etching to be performed with a halogen gas or an acid gas, or through argon milling.

The pattern film 4 of this embodiment may be formed by an imprint technique, a mold injection technique, a PEP technique using a resist, a self-assembling technique using a self-assembled material, or the like. However, to achieve mass productivity, an imprint technique is preferred.

In the following, a method of forming the pattern film 4 by an imprint technique is described. The pattern film 4 is formed as follows. A curable composition for imprint is provided as the to-be-imprinted agent for forming the pattern film 4 between the dummy substrate 2 and a master template having an original fine pattern or a replica template thereof. In this manner, a pattern forming layer is formed, and a mold is pressed against the surface of the pattern forming layer. After that, the pattern forming layer is cured, and the mold is removed. In this manner, the pattern film 4 having a fine concave-convex pattern can be formed.

More specifically, the pattern forming layer made of the to-be-imprinted agent for forming the pattern film 4 is formed on the dummy substrate 2. Where a solvent such as a diluent solvent is used for film thickness adjustment, the pattern forming layer is dried as needed, to form a pattern acceptor (a structure having the pattern forming layer formed on the substrate 2). The mold is then pressed against the surface of the pattern forming layer of the pattern acceptor. As the mold, a master template or a replica template thereof is used. Alternatively, an imprinting agent may be applied onto a mold having a pattern, and the dummy substrate 2 can be pressed against the mold. The pattern of the mold is transferred, and the pattern forming layer having a fine concave-convex pattern is solidified by thermal curing, curing through light irradiation, room-temperature curing, or the like. After that, the mold is removed. In this manner, the pattern film 4 of this embodiment is formed on the dummy substrate 2.

Examples of materials that can be used as the mold include metals, silicon, glass, quartz, light-transmissive resins such as PMMA, polycarbonate resins, and ZEONOR resins, transparent metal deposition films, flexible films such as a polydimethysiloxane film, photo-cured films, and metal films.

The dummy substrate 2 can be made of quartz, glass, or can be a metal substrate made of Ni, Cu, Cr, or Fe, or a resin substrate made of polycarbonate, ZEONOR, or polyimide, for example.

According to the method of forming the pattern film 4 of this embodiment by an imprint technique, the to-be-imprinted agent composition is first applied onto the dummy substrate 2 (the dummy substrate 2 is preferably coated with the composition), to form the pattern forming layer. To apply the to-be-imprinted agent onto the substrate 2, a well-known application technique, or normally, a coating technique, can be used.

When the to-be-imprinted agent forming the pattern film 4 is applied onto the substrate 2, a dip coating technique, an air knife coating technique, a curtain coating technique, a wire bar coating technique, a gravure coating technique, an extrusion coating technique, a spin coating technique, a slit scanning technique, an inkjet technique, or the like can be used to form a film or liquid droplets on the substrate. In this embodiment, the film thickness of the pattern forming layer formed from the composition of the to-be-imprinted agent varies depending on purposes of use, but is approximately 3 nm to 30 μm. In this embodiment, the composition of the to-be-imprinted agent can be applied through multiple applications. Where liquid droplets are formed on the substrate by an inkjet technique or the like, the amount of the liquid droplets is preferably 1 pl to 20 pl.

According to the pattern forming method of this embodiment, the mold is pressed against the surface of the pattern forming layer, to transfer the pattern onto the pattern forming layer. In this manner, the fine pattern formed beforehand in the pressing surface of the mold can be transferred onto the pattern forming layer. The pattern forming layer having the fine concave-convex pattern is cured by thermal curing, curing through light irradiation, room-temperature curing, or the like. After that, the mold is removed, and the pattern film 4 of this embodiment is formed on the dummy substrate 2.

The imprint technique for forming the fine pattern can be a thermal nanoimprint technique using a thermoplastic resin, a photonanoimprint technique using a photopolymerizable monomer or oligomer, or a room-temperature nanoimprint technique using a room-temperature curable material such as SOG (Spin On Glass) or HSQ (Hydrogen Silsesquioxane). However, thermal nanoimprint techniques have problems, such as insufficient filling of the fine pattern of the mold due to the high viscosity of a thermoplastic resin, deformation of a fine pattern due to heat cycles, and flattening of a fine pattern due to the required pressing at high pressure. Therefore, the pattern film 4 is preferably formed by a photonanoimprint technique or a room-temperature nanoimprint technique.

In the following, a method of forming the pattern film 4 by a photonanoimprint technique is described.

As the to-be-imprinted agent for forming the pattern film 4, a photocurable to-be-imprinted agent is used. The photocurable to-be-imprinted agent is a photosensitive composition formed by adding a photopolymerization initiator to a polymerizable compound and diluting the compound with an organic solvent as needed.

Examples of polymerizable compounds that can be used here include polymerizable unsaturated monomers having 1 to 6 ethylenic unsaturated bond-containing groups, polymerizable compounds containing silicon atoms, polymerizable compounds containing fluorine atoms, compounds having oxirane rings (epoxy compounds), vinyl ether compounds, styrene derivatives, propenyl ethers, and butenyl ethers.

Examples of polymerizable unsaturated monomers having 1 to 6 ethylenic unsaturated bond-containing groups (mono- to hexa-functional polymerizable unsaturated monomers) include 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, 1- or 2-naphthyl (meth)acrylate, butanediol mono(meth)acrylate, butoxyethyl (meth)acrylate, butyl (meth)acrylate, cetyl (meth)acrylate, ethyleneoxide (hereinafter referred to as "EO")-modified cresol (meth)acrylate, dipropylene glycol (meth)acrylate, ethoxylated phenyl (meth)acrylate, ethyl (meth)acrylate, isoamyl (meth)acrylate, isobutyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydipropylene glycol (meth)acrylate, methoxytripropylene glycol (meth)acrylate, methoxypolyethylene glycol (meth)acrylate, methoxytriethylene glycol (meth)acrylate, methyl (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromophenyl (meth)acrylate, EO-modified tribromophenyl (meth)acrylate, tridodecyl (meth)acrylate, p-isopropenylphenol, styrene, α-methylstyrene, acrylonitrile, diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate ester neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethyleneurea, divinylpropyleneurea, ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri (meth)acrylate, ditrimethylolpropane tetra(meth)acrylate, pentaerythritol ethoxy-tetra(meth)acrylate, pentaerythritol tetra(meth)acrylate, xylylene di(meth)acrylate, phenanthrenyl (meth)acrylate, phenanthrenylmethyl (meth)acrylate, 9-(4-((meth)acryloyloxy)phenyl)-9-(4-methoxyphenyl) fluorene, 9-(4-((meth)acryloyloxyethoxy)phenyl)-9-(4-hydroxyethoxy)phenyl) fluorene, 9,9-bis(4-((meth)acryloyloxy)phenyl) fluorene, and 9,9-bis(4-((meth)acryloyloxyethoxy)phenyl) fluorene.

As the polymerizable unsaturated monomers having 1 to 6 ethylenic unsaturated bond-containing groups (mono- to hexa-functional polymerizable unsaturated monomers), (meth)acrylates each having an aromatic hydrocarbon structure and/or an alicyclic hydrocarbon structure are preferable, having resistance to dry etching. Specific examples of such (meth)acrylates include benzyl (meth)acrylate, 1- or 2-naphthyl (meth)acrylate, 1- or 2-naphthylmethyl (meth)acrylate, dicyclopentanyl (meth)acrylate, dicyclopentanyloxyethyl (meth)acrylate, isoboronyl (meth)acrylate, adamantyl (meth) acrylate, xylylene di(meth)acrylate, phenanthrenyl (meth) acrylate, phenanthrenylmethyl (meth)acrylate, 9-(4-((meth) acryloyloxy)phenyl)-9-(4-methoxyphenyl) fluorene, 9-(4-((meth)acryloyloxyethoxy)phenyl)-9-(4-hydroxyethoxy) phenyl) fluorene, 9,9-bis(4-((meth)acryloyloxy)phenyl) fluorene, and 9,9-bis(4-((meth)acryloyloxyethoxy)phenyl) fluorene.

Of the above (meth)acrylate compounds, acrylate compounds are more preferable, from the viewpoint of curability.

Examples of the polymerizable compounds containing silicon atoms include 3-tris(trimethylsilyloxy) silylpropyl (meth)acrylate, trimethylsilylethyl (meth)acrylate, polydimethylsiloxane-substituted alkyl (meth)acrylate, and di(meth) acrylate having a polydimethylsiloxane structure.

Examples of the polymerizable compounds containing fluorine atoms include monofunctional polymerizable compounds containing fluorine atoms, such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth) acrylate, tetrafluoropropyl (meth)acrylate, and hexafluoropropyl (meth)acrylate.

Examples of the compounds having oxirane rings (the epoxy compounds) include polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, and epoxidated polybutadienes. Of those compounds, each one may be used singly, or two or more may be combined for use.

Examples of the compounds having oxirane rings (the epoxy compounds) that can be used in a preferred manner in this embodiment include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, and polypropylene glycol diglycidyl ether; polyglycidyl ethers of polyether polyols produced by adding one or more alkylene oxides to aliphatic polyalcohol, such as ethylene glycol, propylene glycol, or glycerin; diglycidyl esters of aliphatic long-chain dibasic acids; monoglycidyl ethers of aliphatic higher alcohols; phenol, cresol, butylphenol, and monoglycidyl ethers of polyether alcohols produced by adding alkyleneoxide to phenol, cresol, or butylphenol; and glycidyl esters of higher fatty acids.

Of those compounds having oxirane rings, the following compounds are particularly preferable: bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether.

Examples of commercial products that can be suitably used as a compound containing a glycidyl group include UVR-6216 (manufactured by Union Carbide Corporation), Glycidol, AOEX24, Cyclomer A200 (all manufactured by Daicel Chemical Industries, Ltd.), Epikote 828, Epikote 812, Epikote 1031, Epikote 872, Epikote CT508 (all manufactured by Yuka Shell), KRM-2400, KRM-2410, KRM-2408, KRM-2490, KRM-2720, and KRM-2750 (all manufactured by Asahi Denka Co., Ltd.). Of those products, each one can be used singly, or two or more products can be combined for use.

As the polymerizable compounds, vinyl ether compounds can also be used. Any known vinyl ether compound can be selected as needed. Examples of such vinyl ether compounds include 2-ethylhexyl vinyl ether, butanediol-1,4-divinylether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, and bisphenol A divinyloxyethyl ether.

Polymerizable compounds to be used in this embodiment can be propenyl ethers and butenyl ethers. Examples of the propenyl ethers and butenyl ethers include 1-dodecyl-1-propenyl ether, 1-dodecyl-1-butenyl ether, 1-butenoxymethyl-2-norbornene, 1-4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, and propenyl ether propylene carbonate.

To increase the detachability from the mold and increase the coating properties, a compound containing fluorine atoms can also be used. Examples of such compounds containing fluorine atoms include trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, and tetrafluoropropyl (meth)acrylate.

Of those compounds, (meth)acrylates each having an aromatic hydrocarbon structure and/or an alicyclic hydrocarbon structure, (meth)acrylates containing silicon atoms, (meth)acrylates containing fluorine atoms, and the like are particularly preferable as the polymerizable compounds to be used for the photocurable to-be-imprinted agent for forming the pattern film 4.

As the photopolymerization initiator to be used for the photosensitive to-be-imprinted agent, any compound that generates an active radical for polymerization of any of the above mentioned polymerizable compounds through light irradiation can be used. Preferred examples of such photopolymerization initiators include cationic polymerization initiators and radical polymerization initiators. Any of those photopolymerization initiators can be used singly, or two or more of those photopolymerization initiators may be combined for use.

The content of the photopolymerization initiator in the entire composition minus the solvent is preferably 0.01% to 15% by mass, or more preferably, 0.1% to 12% by mass, or even more preferably, 0.2% to 7% by mass, for example. Where two or more kinds of photopolymerization initiators are used, the total amount thereof should fall within the above range.

Where the content of the photopolymerization initiator is 0.01% or more by mass, the sensitivity (rapid curability), the resolution capability, the line edge accuracy, and the coating strength tend to be higher, and therefore, the content is preferable. Where the content of the photopolymerization initiator is 15% or less by mass, on the other hand, the light transmittance, the colorability, and the handleability tend to be higher, and therefore, such a content is also preferable. Various studies have been made on the preferred amounts of the photopolymerization initiator and/or the photoacid generator in the inkjet compositions and compositions for liquid crystal display color filters containing dye and/or pigment. However, there have been no reports as to the preferred amounts of the photopolymerization initiator and/or the photoacid generator in curable compositions for nanoimprint. That is, in the systems containing dye and/or pigment, the dye and/or the pigment may act as a radical trapping agent, and can have influence on the photopolymerization and the sensitivity. With this aspect being taken into consideration, the amount of the photopolymerization initiator to be added is optimized for the above mentioned uses.

In the curable composition for the imprint of this embodiment, on the other hand, dye and/or pigment are not essential, and the optimum range of the photopolymerization initiator might differ from those in the fields of inkjet compositions and compositions for liquid crystal display color filters.

As the radical photopolymerization initiator to be used in this embodiment, acylphosphine oxide compounds and oxime ester compounds are preferable, from the viewpoint of curing sensitivity and absorption properties. As the cationic polymerization initiators, sulfonium salt compounds and iodonium salt compounds are preferable. As the radical photopolymerization initiator to be used in this embodiment, a commercially available initiator can be used, for example. The initiators disclosed in paragraph [0091] of JP-A 2008-105414 (KOKAI) can be used in a preferred manner, for example.

A solvent can be used for the curable composition of the to-be-imprinted agent to be used for the pattern film 4, as needed in various cases. In this specification, "solvent" does not contain any of the above mentioned polymerizable monomers. That is, in this specification, "solvent" does not have any of the above mentioned polymerizable functional groups. Particularly, to form a pattern having a film thickness of 500 nm or smaller, the composition preferably contains a solvent. A preferred solvent has a boiling point of 80° C. to 200° C. at normal pressure. As for the type of solvent, it is possible to use any type of solvent, as long as the solvent is capable of dissolving the composition. Preferably, the solvent has at least one of an ester structure, a ketone structure, a hydroxyl group, and an ether structure. Specifically, examples of preferred solvents include a single solvent or combined solvents selected from propylene glycol monomethyl ether acetate, cyclohexanone, 2-heptanone, gamma-butyrolactone, propylene glycol monomethyl ether, and ethyl lactate. From the viewpoint of application uniformity, the most preferred solvent is a solvent containing propylene glycol monomethyl ether acetate.

The content of the solvent in the above described curable composition is optimized by adjusting the viscosity of the components minus the solvent, the coatability of the composition, and the target film thickness. To improve the coatability, however, the content of the solvent is preferably 0% to 99% by mass, or more preferably, 0% to 97% by mass, in the entire composition. Particularly, to form a pattern of 500 nm in film thickness by a technique such as a spin coating technique, the content of the solvent is preferably 20% to 99% by mass, or more preferably, 40% to 99% by mass, or most preferably, 70% to 98% by mass.

To achieve a higher crosslinking density, the above curable composition can contain a polyfunctional oligomer having a larger molecular weight than that of any of the above mentioned polyfunctional monomers within such a range as to achieve the object of this embodiment. Examples of photoradically polymerizable polyfunctional oligomers include various kinds of acrylate oligomers such as polyester acrylates, urethane acrylates, polyether acrylates, and epoxy acrylates. The amount of the oligomer component to be added to the composition is preferably 0% to 30% by mass of the components minus the solvent in the composition, or more preferably, 0% to 20% by mass, or even more preferably, 0% to 10% by mass, or most preferably, 0% to 5% by mass.

To improve the dry etching resistance, the aptitude for imprint, the curability, and the like, the above curable composition can further contain a polymer component. The polymer component is preferably a polymer having a polymerizable functional group in the side chain thereof. The weight-average molecular weight of the polymer component is preferably 2000 to 100000, or more preferably, 5000 to 50000, from the viewpoint of miscibility with polymerizable compounds. The amount of the polymer component to be added is preferably 0% to 30% by mass of the components minus the solvent in the composition, or more preferably, 0% to 20% by mass, or even more preferably, 0% to 10% by mass, or most preferably, 2% or less by mass. Where the content of a compound having a molecular weight of 2000 or more is 30% or less by mass of the components minus the solvent in the composition of this embodiment, the patternability is improved. Therefore, the proportion of this component is preferably small, and, except for the surfactant and other minor additives, the composition preferably contains no resin components.

In addition to the above described components, the curable composition can further contain, as needed, a mold releasing agent, a silane coupling agent, an ultraviolet absorbent, a light stabilizer, an antiaging agent, a plasticizer, an adhesion promoter, a thermal polymerization initiator, a colorant, elastomer particles, a photoacid enhancer, a photobase generator, a basic compound, a flowability promoter, a defoaming agent, and a dispersant.

The curable composition can be produced by mixing the above mentioned components. Mixing and dissolving of a curable composition are normally performed at the range of 0° C. to 100° C. After the above components are mixed, the composition is preferably filtered through a filter of 0.003 μm to 5.0 μm in pore size. The filtration can be performed in multiple stages, or can be repeated a number of times. The filtered solution can be filtered again. Although not specifically limited, the material of the filter to be used for the filtration can be polyethylene resin, polypropylene resin, fluororesin, nylon resin, or the like.

In the curable composition, the viscosity of the mixed solution of all the components minus the solvent is preferably 100 mPa·s or lower, or more preferably, 1 mPa·s to 70 mPa·s, or even more preferably, 2 to 50 mPa·s, or most preferably, 3 to 30 mPa·s.

In this embodiment, "light" includes not only those having wavelengths falling within the ranges of ultraviolet rays, near-ultraviolet rays, far-ultraviolet rays, visible rays, and infrared rays, and electromagnetic waves, but also radiations. Examples of the radiations include microwaves, electron waves, EUV rays, and X-rays. Further, it is possible to use laser beams such as 248-nm excimer laser beams, 193-nm excimer laser beams, and 172-nm excimer laser beams. Those lights can be monochromatic lights (single wavelength lights) that have passed through optical filters, or can be lights with different wavelengths (compound lights). As for the exposure, multiple exposures can be performed, or entire-surface exposure can be performed after a pattern is formed to increase the film strength and the etching resistance.

Where the pattern film 4 is formed by a photonanoimprint technique, a light-transmissive material is used for at least one of the mold material and the dummy substrate 2. According to the photoimprint lithography applied in this embodiment, a pattern forming layer is formed by applying a photosensitive to-be-imprinted agent composition onto the dummy substrate 2. A light-transmissive mold is pressed against the surface of the pattern forming layer, and the back face of the mold is irradiated with light, to cure the pattern forming layer. Alternatively, the photosensitive to-be-imprinted agent composition of this embodiment is applied onto the light-transmissive dummy substrate 2, and a mold is pressed against it. The back face of the dummy substrate 2 is then irradiated with light, to cure the curable composition for imprint.

The light irradiation can be performed while the mold is in contact with the pattern forming layer, or can be performed after the mold is removed from the pattern forming layer. However, in a case where a photosensitive to-be-imprinted agent composition with low viscosity is used for forming fine patterns, it is preferable to perform the light irradiation, with the mold being in contact with the pattern forming layer.

The mold that can be used in this embodiment is a mold having a pattern to be transferred. The pattern on the mold can be formed in accordance with a desired processing accuracy by a photolithography technique, an electronic beam lithography technique, or a self-assembling technique, for example. In this embodiment, however, the method of forming the mold pattern is not particularly limited.

Examples of light-transmissive mold materials include glass, quartz, light-transmissive resins such as PMMA, polycarbonate resins, and ZEONOR resins, transparent metal deposition films, and flexible films such as a polydimethysiloxane film.

The shape of the mold is not particularly limited either, and the mold can be either a plate-like mold or a mold with a roll shape. The mold with a roll shape is used particularly where continuous transfers are required.

The material of the dummy substrate 2 with transparency can be quartz, glass, or a polymer substrate such as a polycarbonate film, for example.

Alternatively, the material of the dummy substrate 2 with transparency can be quartz, glass, or a resin substrate made of polycarbonate, ZEONOR, or polyimide, for example.

In the next step, the pattern film 4 formed on the dummy substrate 2 is used as the template 6. When the pattern film 4 is transferred onto the to-be-imprinted agent 14 on the processed substrate 12 by an imprint technique (FIG. 1(c)), the pattern film 4 is preferably transferred by a photoimprint technique, to achieve mass productivity. Therefore, the dummy substrate 2 preferably has optical transparency. In that case, the mold for forming the pattern film 4 can be non-transparent.

The mold to be used for forming the pattern film 4 can have been subjected to a mold releasing treatment to increase the detachability of the curable composition from the mold surface. Examples of such molds include those subjected to a treatment using silicon- or fluorine-containing silane coupling agent, and commercially available mold releasing agents such as Optool DSX (manufactured by Daikin Industries, Ltd.) and Novec EGC-1720 (manufactured by Sumitomo 3M Limited).

To form the pattern film 4 by using a photonanoimprint technique, the molding pressure is preferably 10 atmospheres or lower. Where the molding pressure is 10 atmospheres or lower, the mold and the substrate are not easily deformed, and the patterning accuracy tends to become higher. Such a molding pressure is also preferred, as the pressure to be applied is low, and the device can be made smaller. The molding pressure is preferably set in a region such that the mold transfer uniformity can be secured within a range such that the remaining film of the curable composition is reduced at the convex portions of the mold.

During the formation of the pattern film 4 by using a photonanoimprint technique, the amount of irradiation light in the step of irradiating the pattern forming layer with light should be sufficiently larger than the amount of irradiation light required for curing. The amount of irradiation light required for curing is determined by examining the consumption of unsaturated bonds by the curable composition and the tackiness of the cured film.

The substrate temperature during the light irradiation is normally room temperature. However, the light irradiation may be performed while heating in order to increase the reactivity. If a vacuum state is created in preparation for the light irradiation, it is possible to effectively prevent contamination with bubbles and a decrease in reactivity due to contamination with oxygen, and to effectively increase the adhesion between the mold and the curable composition. Therefore, the light irradiation can be performed in a vacuum state. During the pattern formation, the degree of vacuum at the time of light irradiation is preferably in the range of $10^{-1}$ Pa to ordinary pressure.

Where the pattern film 4 is formed by using a photo-nanoimprint technique, the light to be used for curing the photosensitive to-be-imprinted agent composition is not particularly limited. Examples of lights that can be used here include lights and radiations with wavelengths falling within the ranges of high-energy ionizing radiations, near-ultraviolet rays, far-ultraviolet rays, visible rays, and infrared rays. Examples of high-energy ionizing radiation sources include accelerators such as a Cockcroft accelerator, a Handegraf accelerator, a linear accelerator, a betatron, and a cyclotron. Electron beams accelerated by any of those accelerators are industrially the most useful and the least expensive. Other than the above, it is possible to use radioisotopes and radiations from nuclear reactors, such as γ-rays, X-rays, α-rays, neutron beams, and proton beams. Examples of ultraviolet ray sources include an ultraviolet fluorescent lamp, a low-pressure mercury lamp, a high-pressure mercury lamp, an ultra-high-pressure mercury lamp, a xenon lamp, a carbon arc lamp, and a solar lamp. Examples of radiations include microwaves and EUV (Extreme Ultra-Violet) rays. In this embodiment, it is also possible to suitably use a LED (Light Emitting Diode), semiconductor laser beams, or laser beams used in semiconductor microfabrication processes, such as 248-nm KrF excimer laser beams and 193-nm ArF excimer means. Those lights can be monochromatic lights or can be lights with different wavelengths (mixed lights).

As to the exposure, the light intensity in the exposure is preferably in the range of 1 mW/cm$^2$ to 50 mW/cm$^2$. By making the light intensity 1 mW/cm$^2$ or higher, the exposure time can be shortened, and accordingly, the productivity becomes higher. By making the light intensity 50 mW/cm$^2$ or lower, degradation of the characteristics of the permanent film due to a side reaction can be restrained in a preferred manner. The exposure amount is preferably in the range of 5 mJ/cm$^2$ to 1000 mJ/cm$^2$. If the exposure amount is less than 5 mJ/cm$^2$, the exposure margin becomes narrower, and the photocuring becomes insufficient. As a result, problems such as unreacted substances adhering to the mold often occur. If the exposure amount exceeds 1000 mJ/cm$^2$, on the other hand, the permanent film might be degraded due to decomposition of the composition.

Further, in the exposure, to prevent hindering of radical polymerization by oxygen, the oxygen concentration can be controlled to be lower than 100 mg/L by introducing an inert gas such as a nitrogen gas or an argon gas.

Further, after the pattern forming layer is cured by light irradiation, the cured pattern can be further cured by heat as needed.

As the mold 6 is removed from the pattern forming layer, the pattern film 4 having excellent etching properties can be formed on the dummy substrate 2 by an imprint technique.

Next, a method of forming the pattern film 4 by a room-temperature nanoimprint technique is described.

A room-temperature imprint technique for performing pressing at room temperature by using a room-temperature to-be-imprinted agent as the to-be-imprinted agent for forming the pattern film 4 is utilized. Here, "room-temperature" means temperatures not lower than 0° C. and not higher than 50° C. As the room-temperature imprint resist, a sol- or gel-based material is used, and SOG having a siloxane dissolved in a solvent is preferably used. Examples of siloxanes that can be used in the SOG include silica glass, alkylsiloxane polymers, alkylsilsesquioxane polymers, hydrogenated silsesquioxane polymers, and hydrogenated alkylsilsesquioxane polymers. Examples of solvents that can be used in the SOG include alcohols such as methanol and ethanol, ketones such as acetylacetone, and esters such as lower alkylesters.

According to the room-temperature imprint technique used in this embodiment, a pattern forming layer is formed by applying a room-temperature to-be-imprinted agent onto the dummy substrate 2, and a mold is pressed against the surface of the pattern forming layer. The pattern forming layer is then cured. Alternatively, the room-temperature to-be-imprinted agent can be applied onto the mold, and the dummy substrate 2 can be pressed against the mold. The pattern forming layer can then be cured.

The curing of the pattern forming layer is performed, with the mold being attached to the pattern forming layer. The mold pressing force is normally approximately 1 MPa to several tens of MPa, and the curing time is several minutes to 1 hour. The curing can be sufficiently performed at room temperature. However, the curing can be facilitated by heating at 50° C. to 150° C. at the time of mold attachment or after the mold detachment, as needed.

The mold that can be used in this embodiment is a mold having a pattern to be transferred. The pattern on the mold can be formed in accordance with a desired processing accuracy by a photolithography technique, an electronic beam lithography technique, or a self-assembling technique, for example. In this embodiment, however, the method of forming the mold pattern is not particularly limited.

Examples of light-transmissive mold materials include glass, metals such as Ni, Cu, Cr, and Fe, quartz, light-transmissive resins such as PMMA, polycarbonate resins, and ZEONOR resins, transparent metal deposition films, and flexible films such as fluorine-based resins and polydimethysiloxane films.

The shape of the mold is not particularly limited either, and the mold can be either a plate-like mold or a mold with a roll shape. The mold with a roll shape is used particularly where continuous transfers are required.

The preferred material of the dummy substrate 2 to be used in the room-temperature imprint technique can be quartz, glass, or a transparent material with high light transmissivity like a resin material such as polycarbonate, ZEONOR, or polyimide.

In the imprint technique of this embodiment, the pressing step is preferably carried out under reduced pressure. Pressing under reduced pressure can be realized by carrying out a pressure reducing step prior to the pressing step, and carrying out an atmosphere releasing step after the pressing step. The atmosphere at the time of pressing is preferably 10 Pa to 5000 Pa, or more preferably, 100 Pa to 1000 Pa. At reduced pressure, the solvent can be sublimated, and void defects can be eliminated.

Step of Transferring the Pattern Film 4

Next, the step of transferring the pattern film 4 by an imprint technique is described.

In this embodiment, the uncured to-be-imprinted agent 14 with poor etching properties is provided between the template mold 6 having the pattern film 4 formed on the dummy substrate 2 and the to-be-processed substrate 12, and an adhesion layer is formed. The face of the pattern film 4 of the mold 6 is pressed against the surface of the adhesion layer, and the adhesion layer formed with the to-be-imprinted agent 14 is cured. The dummy substrate 2 is then detached from the adhesion face of the pattern film 4. In this manner, a substrate having the pattern film 4 adhesion-transferred onto the to-be-processed substrate 12 with the to-be-imprinted agent 14 can be formed.

Specifically, the to-be-imprinted agent 14 is provided on the to-be-processed substrate 12. Where a solvent such as a diluent solvent is used for film thickness adjustment, the to-be-imprinted agent 14 is dried as needed, to form the adhesion layer. The template mold 6 having the pattern film 4 formed on the dummy substrate 2 is pressed against the adhesion layer, and the to-be-imprinted agent 14 is cured. Here, the to-be-imprinted agent 14 is cured by thermal curing, curing through light irradiation, or room-temperature curing. Alternatively, the to-be-imprinted agent 14 can be applied to the pattern film 4 of the mold 6, and the to-be-processed substrate 12 can be pressed against the to-be-imprinted agent 14. The to-be-imprinted agent 14 can then be cured. The to-be-imprinted agent 14 is solidified through the curing, and the pattern film 4 is made to adhere onto the to-be-processed substrate 12. After that, the dummy substrate 2 is detached from the adhesion face of the pattern film 4. In this manner, a substrate having the pattern film 4 adhesion-transferred onto the to-be-processed substrate 12 with the to-be-imprinted agent 14 is formed.

When the to-be-imprinted agent is applied onto the substrate, a well-known application technique, or normally, a coating technique, can be adopted. For example, a dip coating technique, an air knife coating technique, a curtain coating technique, a wire bar coating technique, a gravure coating technique, an extrusion coating technique, a spin coating technique, a slit scanning technique, an inkjet technique, or the like can be used to form a film or liquid droplets on the substrate. In this embodiment, the film thickness of the pattern forming layer formed from the composition of the to-be-imprinted agent varies depending on purposes of use, but is approximately 1 nm to 10 μm.

According to the pattern forming method of this embodiment, the mold 6 is pressed against the surface of the pattern forming layer, to attach the pattern film 4 to the surface. As a result, the fine pattern formed beforehand in the pressing surface of the mold can be transferred onto the pattern forming layer. The pattern forming layer having the fine concave-convex pattern is solidified by thermal curing, curing through light irradiation, room-temperature curing, or the like. After that, the mold 6 is removed, and the pattern film 4 is formed on the dummy substrate 2. At this point, the fine concave pattern portions of the pattern film 4 do not need to be completely filled with the to-be-imprinted agent 14, and only the convex pattern can be attached to the to-be-processed substrate 12. The convex pattern portions are required to remain as the resist mask in the etching step described later, but the concave portions are to be removed by the etching. Therefore, voids formed at the time of the adhesion transfer do not have adverse influences.

The imprint technique to be used for the adhesion-transfer of the pattern film 4 is preferably a photonanoimprint technique using a photopolymerizable monomer or oligomer, or a room-temperature imprint technique using a room-temperature curable adhesive agent. To achieve mass productivity, a photoimprint technique is particularly preferable.

Where the adhesion-transfer of the pattern film 4 is performed by a photoimprint technique, a photocurable to-be-imprinted agent is used as the to-be-imprinted agent 14. A photocurable to-be-imprinted agent is a photosensitive composition formed by adding a photopolymerization initiator to a polymerizable compound and diluting the compound with an organic solvent as needed.

Examples of polymerizable compounds that can be used here include polymerizable unsaturated monomers having 1 to 6 ethylenic unsaturated bond-containing groups, compounds having oxirane rings (epoxy compounds), and isocyanate compounds.

Examples of polymerizable unsaturated monomers having 1 to 6 ethylenic unsaturated bond-containing groups (mono- to hexa-functional polymerizable unsaturated monomers) include 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, 1- or 2-naphthyl (meth)acrylate, butanediol mono(meth)acrylate, butoxyethyl (meth)acrylate, butyl (meth)acrylate, cetyl (meth)acrylate, ethyleneoxide (hereinafter referred to as "EO")-modified cresol (meth)acrylate, dipropylene glycol (meth)acrylate, ethoxylated phenyl (meth)acrylate, ethyl (meth)acrylate, isoamyl (meth)acrylate, isobutyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydipropylene glycol (meth)acrylate, methoxytripropylene glycol (meth)acrylate, methoxypolyethylene glycol (meth)acrylate, methoxytriethylene glycol (meth)acrylate, methyl (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromophenyl (meth)acrylate, EO-modified tribromophenyl (meth)acrylate, tridodecyl (meth)acrylate, p-isopropenylphenol, styrene, α-methylstyrene, acrylonitrile, diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate ester neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth) acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethyleneurea, divinylpropyleneurea, ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, tris((meth)acryloyloxyethoxymethyl) phosphineoxide, tetrahydrofuranyl methyl (meth)acrylate, 2-ethyl-2-methyl-4-((meth)acryloyloxymethyl)-1,3-dioxolane, 2,2-dimethyl-4-((meth)acryloyloxymethyl)-1,3-dioxolane, 2,2-pentamethylene-4-((meth)acryloyloxymethyl)-1,3-dioxolane, 3-ethyl-3-((meth)acryloyloxymethyl) oxetane, and 3-((meth)acryloyloxy) tetrahydrofuran-2-one.

The to-be-imprinted agent 14 is preferably removed promptly at the time of etching, and preferably has a low etching resistance. Therefore, the polymerizable unsaturated monomer having 1 to 6 ethylenic unsaturated bond-containing groups (mono- to hexa-functional polymerizable unsaturated monomer) to be used as the to-be-imprinted agent 14 is preferably a (meth)acrylate not having an aromatic hydrocarbon structure and/or an alicyclic hydrocarbon structure. To increase the adhesion to the processed substrate 12, the to-be-imprinted agent 14 preferably has an oxygenated heterocyclic backbone or a trialkylphosphine oxide backbone, such as a tetrahydrofuran ring, a 1,3-dioxolane ring, γ-butyrolactone (tetrahydrofuran-2-one), or oxetane.

Preferred examples of polymerizable unsaturated monomers having 1 to 6 ethylenic unsaturated bond-containing groups (mono- to hexa-functional polymerizable unsaturated monomers) that can be used as the to-be-imprinted agent 14 include tetrahydrofuranylmethyl (meth)acrylate, 2-ethyl-2-methyl-4-((meth)acryloyloxymethyl)-1,3-dioxolane, 2,2-dimethyl-4-((meth)acryloyloxymethyl)-1,3-dioxolane, 2,2-pentamethylene-4-((meth)acryloyloxymethyl)-1,3-dioxolane, 3-ethyl-3-((meth)acryloyloxymethyl) oxetane, 3-((meth)acryloyloxy) tetrahydrofuran-2-one, tris((meth) acryloyloxyethoxymethyl) phosphineoxide, 2-ethyl-2-butyl-propanediol acrylate, 2-ethylhexyl (meth)acrylate, 2-ethylhexylcarbitol (meth)acrylate, 2-hydroxybutyl (meth) acrylate, 2-hydroxyethyl (meth)acrylate, 2-hydroxypropyl (meth)acrylate, 2-methoxyethyl (meth)acrylate, 3-methoxybutyl (meth)acrylate, 4-hydroxybutyl (meth)acrylate, butanediol mono(meth)acrylate, butoxyethyl (meth)acrylate, butyl (meth)acrylate, cetyl (meth)acrylate, dipropylene glycol (meth)acrylate, isoamyl (meth)acrylate, isobutyl (meth)acrylate, isooctyl (meth)acrylate, methoxydipropylene glycol (meth)acrylate, methoxytripropylene glycol (meth)acrylate, methoxypolyethylene glycol (meth)acrylate, methoxytriethylene glycol (meth)acrylate, methyl (meth)acrylate, nonylphenoxypolypropylene glycol (meth)acrylate, octyl (meth) acrylate, polyethylene glycol (meth)acrylate, polyethylene glycol-polypropylene glycol (meth)acrylate, polypropylene glycol (meth)acrylate, acrylonitrile, diethylene glycol monoethyl ether (meth)acrylate, di(meth)acrylated isocyanurate, 1,3-butylene glycol di(meth)acrylate, 1,4-butanediol di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, triethylene glycol di(meth)acrylate, tripropylene glycol di(meth)acrylate, dipropylene glycol di(meth)acrylate, trimethylolpropane tri(meth)acrylate, tris(acryloxyethyl) isocyanurate, dipentaerythritol hexa(meth)acrylate, dipentaerythritol hydroxy-penta(meth)acrylate, dipentaerythritol poly (meth)acrylate, ditrimethylolpropane tetra(meth)acrylate, pentaerythritol ethoxy-tetra(meth)acrylate, and pentaerythritol tetra(meth)acrylate.

Of the above (meth)acrylate compounds, the acrylate compounds are more preferable, from the viewpoint of curability.

Examples of the compounds having oxirane rings (the epoxy compounds) include polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, and epoxidated polybutadienes. Of those compounds, each one can be used singly, or two or more may be combined for use.

Examples of the compounds having oxirane rings (the epoxy compounds) that can be used in this embodiment include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, and polypropylene glycol diglycidyl ether; polyglycidyl ethers of polyether polyols produced by adding one or more alkylene oxides to aliphatic polyalcohol, such as ethylene glycol, propylene glycol, or glycerin; diglycidyl esters of aliphatic long-chain dibasic acids; monoglycidyl ethers of aliphatic higher alcohols; phenol, cresol, butylphenol, and monoglycidyl ethers of polyether alcohols produced by adding alkyleneoxide to phenol, cresol, or butylphenol; and glycidyl esters of higher fatty acids.

As the photopolymerization initiator to be used for the photosensitive to-be-imprinted agent, any compound that generates an active radical for polymerization of any of the above mentioned polymerizable compounds through light irradiation can be used. Preferred photopolymerization initiators include cationic polymerization initiators and radical polymerization initiators. Any of those photopolymerization initiators can be used singly, or two or more of those photopolymerization initiators can be combined for use.

The content of the photopolymerization initiator in the entire composition minus the solvent is preferably 0.01% to 15% by mass, or more preferably, 0.1% to 12% by mass, or even more preferably, 0.2% to 7% by bass, for example. Where two or more kinds of photopolymerization initiators are used, the total amount thereof should fall within the above range.

As the radical photopolymerization initiator to be used in this embodiment, acylphosphine oxide compounds and oxime ester compounds are preferable, from the viewpoint of curing sensitivity and absorption properties. As the cationic polymerization initiators, sulfonium salt compounds and iodonium salt compounds are preferable. As the radical photopolymerization initiator to be used in this embodiment, a commercially available initiator can be used, for example.

A solvent can be used for the curable composition of the to-be-imprinted agent 14, as needed in various cases. In this specification, "solvent" does not contain any of the above mentioned polymerizable monomers. That is, in this specification, "solvent" does not have any of the above mentioned polymerizable functional groups. Particularly, to form a pattern having a film thickness of 500 nm or smaller, the composition preferably contains a solvent. A preferred solvent has a boiling point of 80° C. to 200° C. at normal pressure. As for the type of solvent, it is possible to use any type of solvent, as long as the solvent is capable of dissolving the composition. Preferably, the solvent has at least one of an ester structure, a ketone structure, a hydroxyl group, and an ether structure. Specifically, examples of preferred solvents include a single solvent or combined solvents selected from propylene glycol monomethyl ether acetate, cyclohexanone, 2-heptanone, gamma-butyrolactone, propylene glycol monomethyl ether, and ethyl lactate. From the viewpoint of application uniformity, the most preferred solvent is a solvent containing propylene glycol monomethyl ether acetate.

The content of the solvent in the composition of the to-be-imprinted agent 14 used in this embodiment is optimized by adjusting the viscosity of the components minus the solvent, the coatability of the composition, and the target film thickness. To improve the coatability, however, the content of the solvent is preferably 0% to 99% by mass, or more preferably, 0% to 97% by mass, in the entire composition. Particularly, to form a pattern of 500 nm or smaller in film thickness by a technique such as a spin coating technique, the content of the solvent is preferably 20% to 99% by mass, or more preferably, 40% to 99% by mass, or most preferably, 70% to 98% by mass.

To achieve a higher crosslinking density, the curable composition of the to-be-imprinted agent 14 can contain a polyfunctional oligomer having a larger molecular weight than that of any of the above mentioned polyfunctional monomers within such a range as to achieve the object of this embodiment. Examples of photoradically polymerizable polyfunctional oligomers include various kinds of acrylate oligomers such as polyester acrylates, urethane acrylates, polyether acrylates, and epoxy acrylates. The amount of the oligomer component to be added to the composition is preferably 0% to 30% by mass of the components minus the solvent in the composition, or more preferably, 0% to 20% by mass, or even more preferably, 0% to 10% by mass, or most preferably, 0% to 5% by mass.

In addition to the above described components, the curable composition of the to-be-imprinted agent 14 can further contain, as needed, a silane coupling agent, an ultraviolet absorbent, a light stabilizer, an antiaging agent, a plasticizer, an adhesion promoter, a thermal polymerization initiator, a colorant, elastomer particles, a photoacid enhancer, a photobase generator, a basic compound, a flowability promoter, a defoaming agent, and a dispersant.

The curable composition of the to-be-imprinted agent 14 can be produced by mixing the above mentioned components. Mixing and dissolving of a curable composition are normally performed at 0° C. to 100° C. After the above components are mixed, the composition is preferably filtered through a filter of 0.003 μm to 5.0 μm in pore size. The filtration can be performed in multiple stages, or can be repeated a number of times. The filtered solution can be filtered again. Although not specifically limited, the material of the filter to be used for the filtration can be polyethylene resin, polypropylene resin, fluororesin, nylon resin, or the like.

In the curable composition of the to-be-imprinted agent 14, the viscosity of the mixed solution of all the components minus the solvent is preferably 100 mPa·s or lower, or more preferably, 1 mPa·s to 70 mPa·s, or even more preferably, 2 mPa·s to 50 mPa·s, or most preferably, 3 mPa·s to 30 mPa·s.

In this embodiment, "light" includes not only those having wavelengths falling within the ranges of ultraviolet rays, near-ultraviolet rays, far-ultraviolet rays, visible rays, and infrared rays, and electromagnetic waves, but also radiations. Examples of the radiations include microwaves, electron waves, EUV rays, and X-rays. Further, it is possible to use laser beams such as 248-nm excimer laser beams, 193-nm excimer laser beams, and 172-nm excimer laser beams. Those lights can be monochromatic lights (single wavelength lights) that have passed through optical filters, or can be lights with different wavelengths (compound lights). As for the exposure, multiple exposures can be performed, or entire-surface exposure can be performed after a pattern is formed to increase the film strength and the etching resistance.

According to the photoimprint technique used in this embodiment, the to-be-imprinted agent 14 is applied onto the to-be-processed substrate 12, and an adhesion layer is formed. The template mold 6 having the pattern film 4 formed on the dummy substrate 2 is pressed against the surface of the adhesion layer. The back face of the mold 6 is then irradiated with light, so that the adhesion layer is cured. At this point, the pattern film 4 is firmly bonded to the to-be-processed substrate 12 by the to-be-imprinted agent 14 having excellent adhesive properties, and the dummy substrate 2 can be thoroughly removed from the adhesion face between the pattern film 4 not having excellent adhesive properties and the dummy substrate 2. In this manner, a substrate having the pattern film 4 adhesion-transferred onto the to-be-processed substrate 12 can be formed.

The mold 6 for forming the pattern film 4 can have been subjected to a mold releasing treatment to increase the detachability of the curable composition from the mold surface. Examples of such molds include those subjected to a treatment using silicon- or fluorine-containing silane coupling agent, and commercially available mold releasing agents such as Optool DSX (manufactured by Daikin Industries, Ltd.) and Novec EGC-1720 (manufactured by Sumitomo 3M Limited).

To form the pattern film 4 by using a photonanoimprint technique, the molding pressure is preferably 10 atmospheres or lower. Where the molding pressure is 10 atmospheres or lower, the mold and the substrate are not easily deformed, and the patterning accuracy tends to become higher. Such a molding pressure is also preferred, as the pressure to be applied is low, and the device can be made smaller. The molding pressure is preferably set in a region such that the mold transfer uniformity can be secured within a range such that the remaining film of the curable composition is reduced at the convex portions of the mold.

During the formation of the pattern film 4 by using a photonanoimprint technique, the amount of irradiation light in the step of irradiating the pattern forming layer with light should be sufficiently larger than the amount of irradiation light required for curing. The amount of irradiation light required for curing is determined by examining the consumption of unsaturated bonds by the curable composition and the tackiness of the cured film.

The substrate temperature during the light irradiation is normally room temperature. However, the light irradiation can be performed while heating is performed to increase the reactivity. If a vacuum state is created in preparation for the light irradiation, it is possible to effectively prevent contamination with bubbles and a decrease in reactivity due to contamination with oxygen, and to effectively increase the adhesion between the mold and the curable composition. Therefore, the light irradiation can be performed in a vacuum state. During the pattern formation, the degree of vacuum at the time of light irradiation is preferably in the range of $10^{-1}$ Pa to ordinary pressure.

Where the pattern film 4 is formed by using a photo-nanoimprint technique, the light to be used for curing the photosensitive to-be-imprinted agent composition is not particularly limited. Examples of lights that can be used here include lights and radiations with wavelengths falling within the ranges of high-energy ionizing radiations, near-ultraviolet rays, far-ultraviolet rays, visible rays, and infrared rays. Examples of high-energy ionizing radiation sources include accelerators such as a Cockcroft accelerator, a Handegraf accelerator, a linear accelerator, a betatron, and a cyclotron. Electron beams accelerated by any of those accelerators are industrially the most useful and the least expensive. Other than the above, it is possible to use radioisotopes and radiations from nuclear reactors, such as γ-rays, X-rays, α-rays, neutron beams, and proton beams. Examples of ultraviolet ray sources include an ultraviolet fluorescent lamp, a low-pressure mercury lamp, a high-pressure mercury lamp, an ultra-high-pressure mercury lamp, a xenon lamp, a carbon arc lamp, and a solar lamp. Examples of radiations include microwaves and EUV (Extreme Ultra-Violet) rays. In this embodiment, it is also possible to suitably use a LED (Light Emitting Diode), semiconductor laser beams, and laser beams used in semiconductor microfabrication processes, such as 248-nm KrF excimer laser beams and 193-nm ArF excimer means. Those lights can be monochromatic lights or can be lights with different wavelengths (mixed lights).

As to the exposure, the light intensity in the exposure is preferably in the range of 1 $mW/cm^2$ to 50 $mW/cm^2$. By making the light intensity 1 $mW/cm^2$ or higher, the exposure time can be shortened, and accordingly, the productivity becomes higher. By making the light intensity 50 $mW/cm^2$ or lower, degradation of the characteristics of the permanent film due to a side reaction can be restrained in a preferred manner. The exposure amount is preferably in the range of 5 $mJ/cm^2$ to 1000 $mJ/cm^2$. If the exposure amount is less than 5 $mJ/cm^2$, the exposure margin becomes narrower, and the photocuring becomes insufficient. As a result, problems such as unreacted substances adhering to the mold often occur. If the exposure amount exceeds 1000 $mJ/cm^2$, on the other hand, the permanent film might be degraded due to decomposition of the composition.

Further, in the exposure, to prevent hindering of radical polymerization by oxygen, the oxygen concentration can be controlled to be lower than 100 mg/L by introducing an inert gas such as a nitrogen gas or an argon gas.

Further, after the pattern forming layer is cured by light irradiation, the cured pattern may be further cured by heat as needed.

As the mold 6 is removed from the pattern forming layer, the pattern film 4 having excellent etching properties can be formed on the dummy substrate 2 by an imprint technique.

Next, a method of forming the pattern of the pattern film 4 adhesion-transferred onto the to-be-processed substrate 12 is described. According to the pattern forming method of this embodiment, the difference in etching rate between the pattern film 4 and the cured film of the to-be-imprinted agent 14 as the adhesion layer is utilized, and only the convex portions of the pattern film 4 are left as the pattern bonded with the to-be-imprinted agent 14 by a dry etching technique or a wet etching technique. The other portions including the concave portions of the pattern film 4 and the to-be-imprinted agent 14 are removed. In this manner, the pattern is formed.

The etching rate (speed ratio) of the cured film of the to-be-imprinted agent 14 is preferably at least 1.5 times as high as the etching rate of the pattern film 4. To perform an accurate transfer, a higher etching rate ratio is better. Therefore, it is more preferable that the etching rate of the cured film of the to-be-imprinted agent 14 is at least twice as high as the etching rate of the pattern film 4.

As the dry etching technique, reactive ion etching (RIE) using a reactive gas such as an oxygen gas, a chlorine-based gas, or a fluorine-based gas, or physical dry etching such as ion milling can be used. The plasma source of RIE is preferably ICP (Inductively Coupled Plasma) that is capable of generating high-density plasmas at low pressure. However, ECR (Electron Cyclotron Resonance) plasma or a conventional parallel-plate RIE device can also be used.

Examples of etching gases that can be used here include well-known gases for dry etching, such as Ar, $H_2$, $N_2$, $O_2$, CO, $CO_2$, $CF_4$, $CHF_3$, $CH_2F_2$, $C_2F_6$, $C_3F_6$, $C_4F_8$, $NH_3$, $Cl_2$, $BCl_3$, and $SF_6$. Each of those gases can be used singly, or two or more of those gases can be combined for use.

As the wet etching technique, organic-solvent etching using a developer containing an organic solvent, or alkali etching using a developer containing an aqueous alkali solution can be used.

Examples of organic-solvent-containing developers that can be used here include N-methyl-2-pyrrolidone, N,N-dimethylacetoamide, N,N-dimethylformamide, dimethylsulfoxide, tetramethylurea, hexamethylphosphate triamide, γ-butyrolactone, water, alcohols, ketones, esters, lactones, ethers, halogenated hydrocarbons, and hydrocarbons. More specific examples of such organic-solvent-containing developers include methanol, ethanol, isopropyl alcohol, acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, and xylene. Of those materials, each one can be used singly, or two or more may be combined for use.

Examples of aqueous alkali solutions that can be used as the developer include aqueous solutions of alkali metal hydroxides such as caustic potash and caustic soda, quaternary ammonium hydroxides such as tetramethyl ammonium hydroxide, tetraethyl ammonium hydroxide, and choline, and aqueous amine solutions such as ethanolamine, propylamine, and ethylenediamine.

After the developing and etching, rinsing is performed with water or a poor solvent. As the rinse solution, methanol, ethanol, isopropyl alcohol, benzene, toluene, xylene, methyl cellosolve, or water is used, for example.

At the time of wet etching, the method of developing the pattern film is not particularly limited. However, dipping, spraying, or puddling can be used, for example. Of those techniques, puddling is particularly preferable.

As for the etching technique for the pattern formation, to maintain the pattern shape and prevent detachment of the pattern, RIE (Reactive Ion Etching) using a processing gas such as $O_2$ or $CF_4$ is preferable.

Next, the step of transferring a pattern onto the to-be-processed substrate 12 and processing the to-be-processed substrate 12 is described.

According to the pattern forming method of this embodiment, the adhesion-transfer pattern 4a of the pattern film 4, which is formed in the step illustrated in FIG. 1(d), is used as a mask, and pattern transfer processing is performed on the to-be-processed substrate 12, to form a pattern on the to-be-processed substrate 12. To perform an accurate transfer, a higher etching rate ratio between the to-be-processed substrate 12 and the adhesion-transfer pattern 4a is better, but the etching rate ratio is preferably 1 or higher.

As the dry etching technique, reactive ion etching (RIE) using a reactive gas such as an oxygen gas, a chlorine-based gas, or a fluorine-based gas, or physical dry etching such as ion milling can be used. The plasma source of RIE is preferably ICP (Inductively Coupled Plasma) that is capable of generating high-density plasmas at low pressure. However, ECR (Electron Cyclotron Resonance) plasma or a conventional parallel-plate RIE device can also be used.

Examples of etching gases that can be used here include well-known gases for dry etching, such as Ar, $H_2$, $N_2$, $O_2$, CO, $CO_2$, $CF_4$, $CHF_3$, $CH_2F_2$, $C_2F_6$, $C_3F_6$, $C_4F_8$, $NH_3$, $Cl_2$, $BCl_3$, and $SF_6$. Each of those gases can be used singly, or two or more of those gases can be combined for use. Further, any of those gases can be appropriately selected depending on the film type of the pattern-transferred layer of the to-be-processed substrate 12, so that an etching gas compatible with each film type can be used. Examples of etching gases for $n^+$-type amorphous Si and s-Si include carbon (or chlorine) tetrafluoride+oxygen and carbon tetrafluoride (or sulfur hexafluoride)+hydrogen chloride (or chlorine). Examples of etching gases for amorphous SiNx include carbon tetrafluoride+oxygen. Examples of etching gases for amorphous SiOx include carbon tetrafluoride+oxygen and carbon trifluoride+oxygen. Examples of etching gases for Ta include carbon tetrafluoride (or sulfur hexafluoride)+oxygen. Examples of etching gases for MoTa/MoW include carbon tetrafluoride+oxygen. Examples of etching gases for Cr include chlorine+oxygen. Examples of etching gases for Al include boron trichloride+chlorine, hydrogen bromide, hydrogen bromide+chlorine, and hydrogen iodide.

The etching solution to be used for performing wet etching is not particularly limited, but a suitable solution can be selected depending on the film type of the pattern-transferred layer of the to-be-processed substrate 12. Examples of etching solutions for Cr include a ceric ammonium nitrate solution and a mixture of ceric nitrate and hydrogen peroxide water. Examples of etching solutions for Ti include diluted hydrofluoric acid and a mixture of hydrofluoric acid and nitric acid. Examples of etching solutions for Ta include a mixture of an ammonium solution and hydrogen peroxide water. Examples of etching solutions for Mo include hydrogen peroxide water, a mixture of ammonia water and oxygen peroxide water, and a mixture of phosphoric acid and nitric acid. Examples of etching solutions for MoW and Al include a mixture of phosphoric acid and nitric acid, a mixture of hydrofluoric acid and nitric acid, and a mixture of phosphoric acid, nitric acid, and acetic acid. Examples of etching solutions for ITO include diluted aqua regia, a ferric chloride solution, and hydrogen iodide water. Examples of etching solutions for SiNx and $SiO_2$ include buffered hydrofluoric acid and a mixture of hydrofluoric acid and ammonium fluoride. Examples of etching solutions for Si and poly-Si include a mixture of hydrofluoric acid, nitric acid, and acetic acid. Examples of etching solutions for W include a mixture of ammonium water and hydrogen peroxide water. Examples of etching solutions for PSG include a mixture of nitric acid and hydrofluoric acid. Examples of etching solutions for BSG include a mixture of hydrofluoric acid and ammonium fluoride.

The wet etching can be performed by spraying or dipping. Since the etching rate, the in-plane uniformity, and the interconnect width accuracy greatly depend on the processing temperature, the conditions need to be optimized in accordance with the type of substrate, the purpose of use, and the line width. Where the wet etching is performed, postbaking is preferably performed to prevent undercutting due to penetration of the etching solution. Normally, the postbaking can be performed at approximately 90° C. to 140° C.

As the dry etching technique, reactive ion etching (RIE) using a reactive gas such as an oxygen gas, a chlorine-based gas, or a fluorine-based gas, or physical dry etching such as ion milling can be used.

As the etching for the pattern formation on the to-be-processed substrate 12, dry etching such as RIE (Reactive Ion Etching) or ion milling is preferable, from the viewpoint of pattern form accuracy and dimensional precision at the time of the transfer.

Lastly, the resist (the pattern 4a) remaining on the substrate 12 is removed as needed. However, the method of removing the resist 4a is not particularly limited, and can be appropriately selected from known resist removal techniques. Examples of known removal techniques that can be used for removing the resist film include a technique by which the resist 4a is removed with a solution that is capable of dissolving the resist 4a (wet stripping), a technique by which the resist 4a is oxidized and transformed into a gas by plasma discharge of an oxygen gas under reduced pressure (dry stripping/ashing), a technique by which the resist 4a is oxidized and transformed into a gas by ozone and UV rays (dry removal/UV ashing), and a technique by which the resist 4a existing on the substrate 12 is decomposed and removed by heating the substrate 12 (heating decomposition).

As described so far, according to this embodiment, excellent mass productivity can be achieved, and defects can be prevented from appearing in fine patterns.

Example 1

Next, examples are described.

First Step

As shown in FIG. 1(a), a quartz glass substrate (a first substrate) 2 was coated with IMP-A1 (a first to-be-imprinted agent) having a high etching resistance as shown in FIG. 3 by using a spinner, to form an imprint composition film 4 of approximately 30 nm in film thickness.

At room temperature (25° C.), a mold (not shown) with convex portions was pressed against the imprint composition film 4 with a pressing force of 5 MPa for ten seconds. At this point, a nickel stamper having holes of 10 nm in diameter and a hole pitch of 20 nm was used as the mold.

UV rays were irradiated to the back face of the quartz glass substrate 2. After that, the mold was removed, and a pattern film with convex portions was formed on the first substrate 2.

When the obtained pattern film was observed with an AFM (Atomic Force Microscope), it was confirmed that a pattern film having a dot pattern with dots of 10 nm in diameter and a dot pitch of 20 nm was appropriately formed on the substrate 2, without any defect such as a missing dot.

Second Step

As shown in FIG. 1(a), a silicon wafer (a second substrate) 12 was coated thereon with IMP-B1 (a second to-be-imprinted agent) that had a low etching resistance and excellent adhesive properties as shown in FIG. 3 by using a spinner, to form an imprint composition film 14 of approximately 30 nm in film thickness.

As shown in FIG. 1(b), the pattern film 4 with convex portions formed on the first substrate 2 was pressed against the imprint composition film 14 with a pressing force of 5 MPa for ten seconds.

As shown in FIG. 1(c), UV rays were irradiated to the back face of the quartz glass substrate 2. After that, the quartz glass substrate 2 as the first substrate was detached, and a pattern film with convex portions was adhesion-transferred onto the second substrate 12 in a reversed fashion. At this point, the quartz glass substrate 2 was thoroughly detached from the adhesion face with the pattern film 4, and the transferred pattern film 4 was bonded to the second substrate 12 without any defective transfer.

Third Step

As shown in FIG. 1(d), dry etching using an oxygen gas was performed on the adhesion face of the pattern film of the silicon wafer (the second substrate) 12 having the pattern film 4 transferred thereon. As a result, a dot pattern having only the dots 4a of the convex portions of the cured film of the first to-be-imprinted agent was formed.

When the obtained dot pattern was observed with an AFM, it was confirmed that a dot pattern having dots of 10 nm in diameter and a dot pitch of 20 nm was appropriately formed on the silicon wafer (the second substrate) 12, without any defect such as a missing dot.

Fourth Step

Figure 4:
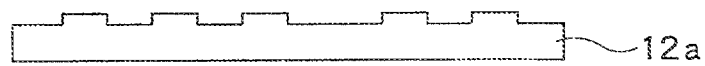
FIG. 4 is a cross-sectional view of a substrate manufactured according to Example 1.

As shown in FIG. 4, dry etching using a $SF_6$ gas was performed on the silicon wafer (the second substrate) 12 having the dot pattern 4a of the cured film of the to-be-imprinted agent formed thereon. Since the etching resistance of the dot pattern of the cured film of the to-be-imprinted agent is high, the dot pattern 4a functions as a mask. Accordingly, a substrate 12a having a desired dot pattern with only the convex portions selectively left on the surface of the silicon wafer (the second substrate) 12 was formed.

When the obtained dot pattern was observed with an AFM, it was confirmed that a dot pattern having dots of 10 nm in diameter and a dot pitch of 20 nm was appropriately formed on the silicon wafer (the second substrate) 12a, without any defect such as a missing dot.

Examples 2 Through 10

In each of Examples 2 through 10 shown in FIGS. 5A and 5B, the same processes as those in Example 1 were performed, and a dot pattern having dots of 10 nm in diameter and a dot pitch of 20 nm was also formed on a silicon wafer or a magnetic film substrate.

More specifically, as shown in FIGS. 5A and 5B, Example 2 is the same as Example 1, except that polycarbonate was used as the first substrate. Example 3 is the same as Example 2, except that a quartz stamper was used as the mold in the first step. Example 4 is the same as Example 1, except that IMP-B2 was used as the second to-be-imprinted agent in the second step. Example 5 is the same as Example 1, except that a magnetic film substrate was used as the second substrate, and Ar gas milling was used as the etching in the fourth step. Example 6 is the same as Example 1, except that IMP-A2 was used as the first to-be-imprinted agent. Example 7 is the same as Example 1, except that IMP-A3 was used as the first to-be-imprinted agent. Example 8 is the same as Example 1, except that IMP-A4 was used as the first to-be-imprinted agent. Example 9 is the same as Example 1, except that IMP-A5 was used as the first to-be-imprinted agent. Example 10 is the same as Example 9, except that a magnetic film substrate was used as the second substrate, and Ar gas milling was used as the etching in the fourth step.

Comparative Example 1

Next, Comparative Example 1 is described.

As shown in FIG. 2(a), a silicon wafer (a second substrate) 12 was coated thereon with IMP-A1 (a first to-be-imprinted agent) shown in FIG. 3 by using a spinner, to form an imprint composition film 15 of approximately 30 nm in film thickness.

At room temperature (25° C.), a mold 7 with concave portions was pressed against the imprint composition film 15 with a pressing force of 5 MPa for ten seconds. At this point, a quartz stamper having holes of 10 nm in diameter and a hole pitch of 20 nm was used as the mold 7.

UV rays were irradiated to the back face of the quartz stamper. After that, the mold 7 was removed, and a pattern film did not adhere to the silicon wafer 12 but adhered to the mold 7. As a result, a desired pattern film was not formed (FIG. 6).

Some improvements were made after a mold releasing treatment, a surface treatment to increase the adhesion of the silicon wafer, and the like were performed. However, there were a number of defects such as missing dots, and a preferred pattern film was not formed on the silicon wafer 12.

In Comparative Examples 2 through 4 shown in FIG. 6, the results were the same as those in Comparative Example 1. Specifically, Comparative Example 2 is the same as Comparative Example 1, except that a magnetic film substrate was used as the substrate 12. Comparative Example 3 is the same as Comparative Example 1, except that IMP-A2 was used as the to-be-imprinted agent. Comparative Example 4 is the same as Comparative Example 1, except that IMP-A5 was used as the to-be-imprinted agent.

Comparative Example 5 is the same as Comparative Example 1, except that IMP-X1 was used as the to-be-imprinted agent, and $O_2$ dry etching was used in the etching step. In Comparative Example 5, a pattern film of the to-be-imprinted agent was formed on the silicon wafer. However, the etching resistance was low, and therefore, a dot pattern was not formed on the silicon wafer.

As described so far, each of the embodiment and examples can provide a pattern forming method that excels in mass productivity and is capable of preventing defects from appearing in fine patterns.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A pattern forming method comprising:
   forming a pattern film on a face of a first substrate, the face of the first substrate being substantially flat, the pattern film having a first pattern, the first pattern having first concave portions and first convex portions, the pattern film comprising a material containing a first to-be-imprinted agent;

forming a material film on a second substrate, the material film containing a second to-be-imprinted agent having a higher etching rate than an etching rate of the first to-be-imprinted agent;

applying pressure between the first substrate and the second substrate, with the pattern film being positioned to face the material film, and curing the second to-be-imprinted agent to form a second pattern having second concave portions and second convex portions in the material film, with each of the first convex portions fitting a corresponding one of the second concave portions and each of the second convex portions fitting a corresponding one of the first concave portions;

detaching the first substrate from the pattern film and leaving the first pattern on the second pattern; and etching the second convex portions to leave the first pattern on the second substrate.

2. The method according to claim 1, further comprising processing the second substrate, with a mask being the pattern film remaining on the second substrate.

3. The method according to claim 1, wherein the etching rate of the second to-be-imprinted agent is at least 1.5 times as high as the etching rate of the first to-be-imprinted agent.

4. The method according to claim 1, wherein the first to-be-imprinted agent has higher adhesion to the second to-be-imprinted agent than adhesion to the first substrate.

5. The method according to claim 1, wherein
the first substrate is made of a transparent material to allow light to pass,
the second to-be-imprinted agent is a photocurable resin, and
the second to-be-imprinted agent is cured by light irradiation from a side of the first substrate.

6. The method according to claim 1, wherein bottom portions of the first concave portions have the same material as that of the pattern film, and the bottom portions of the first concave portions are etched before the second convex portions are etched.

7. The method according to claim 1, wherein bottom portions of the second concave portions have the same material as that of the material film.

* * * * *